United States Patent [19]

Berringer

[11] Patent Number: 5,719,519

[45] Date of Patent: Feb. 17, 1998

[54] CIRCUIT AND METHOD FOR RECONSTRUCTING A PHASE CURRENT

[75] Inventor: Kenneth A. Berringer, Scottsdale, Ariz.

[73] Assignee: Motorola, Inc., Schaumburg, Ill.

[21] Appl. No.: 560,155

[22] Filed: Nov. 20, 1995

[51] Int. Cl.[6] .................................................. H03K 17/56
[52] U.S. Cl. ..................... 327/423; 327/482; 327/488; 361/31; 361/93
[58] Field of Search ........................ 327/72, 90, 94, 327/95, 423, 424, 432, 436, 456, 460, 470, 482, 488; 361/31, 91, 93

[56] References Cited

U.S. PATENT DOCUMENTS

| | | |
|---|---|---|
| 3,696,305 | 10/1972 | Mitchell et al. |
| 4,209,717 | 6/1980 | Mahony . |
| 4,361,769 | 11/1982 | Hatchett et al. . |
| 4,691,125 | 9/1987 | Rybicki . |
| 4,771,357 | 9/1988 | Lorincz et al. ............... 361/87 |
| 4,777,578 | 10/1988 | Jahns . |
| 4,860,154 | 8/1989 | Fazlollahi .................. 361/101 |
| 4,890,009 | 12/1989 | Miyazaki et al. ............ 327/108 |
| 4,928,219 | 5/1990 | Roslund et al. .............. 363/54 |
| 5,233,287 | 8/1993 | Lenk ......................... 323/268 |
| 5,245,523 | 9/1993 | Juzswik ...................... 363/56 |
| 5,325,258 | 6/1994 | Choi et al. .................. 361/87 |
| 5,502,610 | 3/1996 | Chaney ...................... 361/18 |
| 5,550,702 | 8/1996 | Schmidt et al. ............. 361/103 |

Primary Examiner—Terry Cunningham
Attorney, Agent, or Firm—Ziye Zhou; Rennie William Dover

[57] ABSTRACT

A phase current reconstruction circuit (10) senses and reconstructs a phase current in a phase bridges (12A). An amplifier (32) in a phase current reconstruction element (22) amplifies a voltage signal across a sensing resistor (18). The amplified voltage signal is transmitted to a sample and hold circuit (34), which reconstructs the phase current in the phase bridge (12A). An over-current comparator (36) compares the amplified voltage signal with a predetermined reference voltage to detect an over-current in the phase bridge(12A). If the over-current in the phase bridge (12A) is detected, an over-current latch (38) interrupts the pulse width modulation signal from a microcontroller (26) to a power switch (16A) in the phase bridge (12A), thereby switching off and protecting the power switch (16A) from damage that may be caused by the over-current.

20 Claims, 3 Drawing Sheets

CIRCUIT AND METHOD FOR RECONSTRUCTING A PHASE CURRENT

BACKGROUND OF THE INVENTION

The present invention relates, in general, to phase currents, and more particularly, to sensing and reconstructing phase currents.

Motors are used in industrial applications such as fans, pumps, conveyor belts, electric vehicles, etc. Two important aspects in controlling these motors are sensing and reconstructing the phase currents. Sensing and reconstructing the phase currents are important in applications such as alternating current (AC) induction motors, brushless direct current (DC) motors, and uninterruptable power supplies (UPS). Two reasons for sensing and reconstructing the phase currents are controlling the operation of the motor and protecting the power switches that are part of a bridge network from over-current damages.

Because the phase currents have a low frequency in many applications, transformers cannot be used in a sensing and reconstruction circuit. A common approach uses a single sensing resistor to sense the direct current (DC). However, the DC sensing approach does not effectively protect the power switches in the circuit from a peak over-current. Furthermore, the DC sensing approach does not provide enough information, e.g., the power factor, for the microcontroller to control the motor operation properly. Two other approaches for sensing and reconstructing the phase currents include using Hall effect sensors and using a sensing resistor to sense each phase and using an isolation amplifier to amplify a voltage signal across the sensing resistor. However, these approaches are very expensive.

Accordingly, it would be advantageous to have a circuit and a method for sensing and reconstructing the phase current of, for example, a motor that protects the power switches in each phase bridge from over-currents and provides sufficient information for the microcontroller to properly control the motor. It is also desirable for the circuit to be inexpensive, simple, and sufficiently small to be easily integrated into a power module.

DETAILED DESCRIPTION OF THE DRAWINGS

Figure 1:
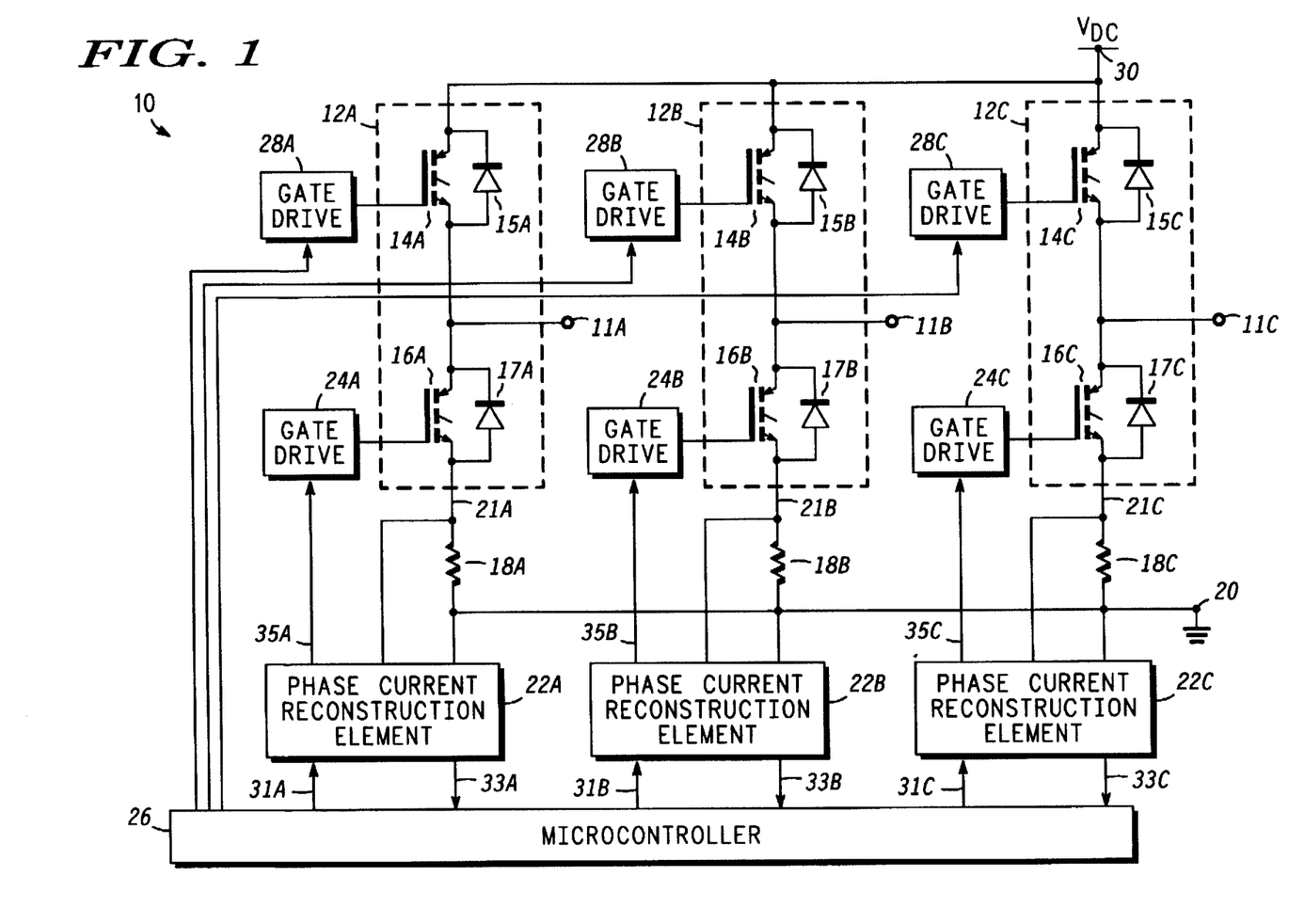
FIG. 1 is block diagram of a phase current reconstruction circuit in accordance with an embodiment of the present invention.

FIG. 1 is a block diagram of a phase current reconstruction circuit 10 in accordance with an embodiment of the present invention. By way of example, phase current reconstruction circuit 10 is a motor controller for a three-phase alternating current motor. Phase current reconstruction circuit 10 includes phase bridges 12A, 12B, and 12C, sensing resistors 18A, 18B, and 18C, phase current reconstruction elements 22A, 22B, and 22C, a microcontroller 26, and gate drive circuits 24A, 24B, 24C, 28A, 28B, and 28C.

Phase bridge 12A includes an upper leg and a lower leg. The upper leg includes an insulated gate bipolar transistor (IGBT) 14A and a diode 15A, and the lower leg includes an IGBT 16A and a diode 17A. An anode of diode 15A is connected to an emitter electrode of IGBT 14A. A cathode of diode 15A is connected to a collector electrode of IGBT 14A. The collector electrode of IGBT 14A is connected to a node 30 for receiving an upper supply voltage, $V_{DC}$. An anode of diode 17A is connected to an emitter electrode of IGBT 16A. A cathode of diode 17A is connected to a collector electrode of IGBT 16A. The collector electrode of IGBT 16A is connected to the emitter electrode of IGBT 14A and to a node 11A for providing a phase output of phase bridge 12A. The emitter electrode of IGBT 16A is connected to a node 21A, which is coupled through sensing resistor 18A to a node 20 for receiving a lower supply voltage, e.g., a ground voltage level.

A first sensing input and a second sensing input of phase current reconstruction element 22A are connected across sensing resistor 18A. A control input 31A of phase current reconstruction element 22A is coupled for receiving a control signal from a corresponding lower output of microcontroller 26. An output 33A of phase current reconstruction element 22A is coupled for providing an analog signal to a corresponding input of microcontroller 26. A control output 35A of phase current reconstruction element 22A is coupled to a gate electrode of IGBT 16A via gate drive circuit 24A. An input of gate drive circuit 28A is connected to a corresponding upper output of microcontroller 26 and an output of gate drive circuit 28A is connected to a gate electrode of IGBT 14A.

Phase bridge 12B includes IGBTs 14B and 16B and diodes 15B and 17B, and is structurally similar to phase bridge 12A. Phase bridge 12B is coupled to a node 21B, sensing resistor 18B, a node 11B, phase current reconstruction element 22B, gate drive circuits 24B and 28B, and the corresponding input and outputs of microcontroller 26 in the same way that phase bridge 12A is coupled to node 21A, sensing resistor 18A, node 11A, phase current reconstruction element 22A, gate drive circuits 24A and 28A, and the corresponding input and outputs of microcontroller 26.

Likewise, phase bridge 12C includes IGBTs 14C and 16C and diodes 15C and 17C, and is structurally similar to phase bridge 12A. Phase bridge 12C is coupled to a node 21C, sensing resistor 18C, a node 11C, phase current reconstruction element 22C, gate drive circuits 24C and 28C, and the corresponding input and outputs of microcontroller 26 in the same way that phase bridge 12A is coupled to node 21A, sensing resistor 18A, node 11A, phase current reconstruction element 22A, gate drive circuits 24A and 28A, and the corresponding input and outputs of microcontroller 26.

It should be understood that the IGBTs in phase bridges 12A, 12B, and 12C function as power switches and, therefore, are not limited to being IGBTs in the present invention. Any power switch having a control electrode and two current conducting electrodes can replace the IGBTs in phase bridges 12A, 12B, and 12C. For example, the IGBTs in phase bridges 12A, 12B, and 12C may be replaced with power field effect transistors, bipolar transistors, or the like.

It should also be understood that the present invention is not limited to the three-phase current reconstruction circuit as shown in FIG. 1. A phase current reconstruction circuit of any number of phases can be built by including the corresponding number of phase bridges like phase bridge 12A, sensing resistors like sensing resistor 18A, phase current reconstruction elements like phase current reconstruction element 22A, and gate drive circuits like gate drive circuits 24A and 28A in the phase current reconstruction circuit and adjusting the inputs and outputs of microcontroller 26 accordingly.

In operation, phase current reconstruction elements 22A, 22B, and 22C sense the currents in the lower legs of phase bridges 12A, 12B, and 12C, respectively, by sensing the voltages across the corresponding sensing resistors 18A, 18B, and 18C. Then, phase current reconstruction elements 22A, 22B, and 22C reconstruct the phase currents from the currents sensed in the lower legs of phase bridges 12A, 12B, and 12C. The reconstructed phase currents provide microcontroller 26 with enough information to calculate parameters such as current vector and power factor. Microcontroller 26 drive circuits the upper legs of phase bridges 12A, 12B, and 12C through gate drive circuits 28A, 28B, and 28C, respectively. Phase current reconstruction elements 22A, 22B, and 22C transmit pulse width modulation signals from microcontroller 26 to gate drive circuits 24A, 24B, and 24C, respectively, to drive the lower legs of corresponding phase bridges 12A, 12B, and 12C. If an over-current is sensed in the lower leg of a phase bridge 12A, 12B, or 12C, the corresponding phase current reconstruction element 22A, 22B, or 22C terminates the transmission of the pulse width modulation signal to a corresponding gate drive circuit 24A, 24B, or 24C, thereby switching off the corresponding IGBT 16A, 16B, or 16C of phase bridge 12A, 12B, or 12C, respectively.

Figure 2:
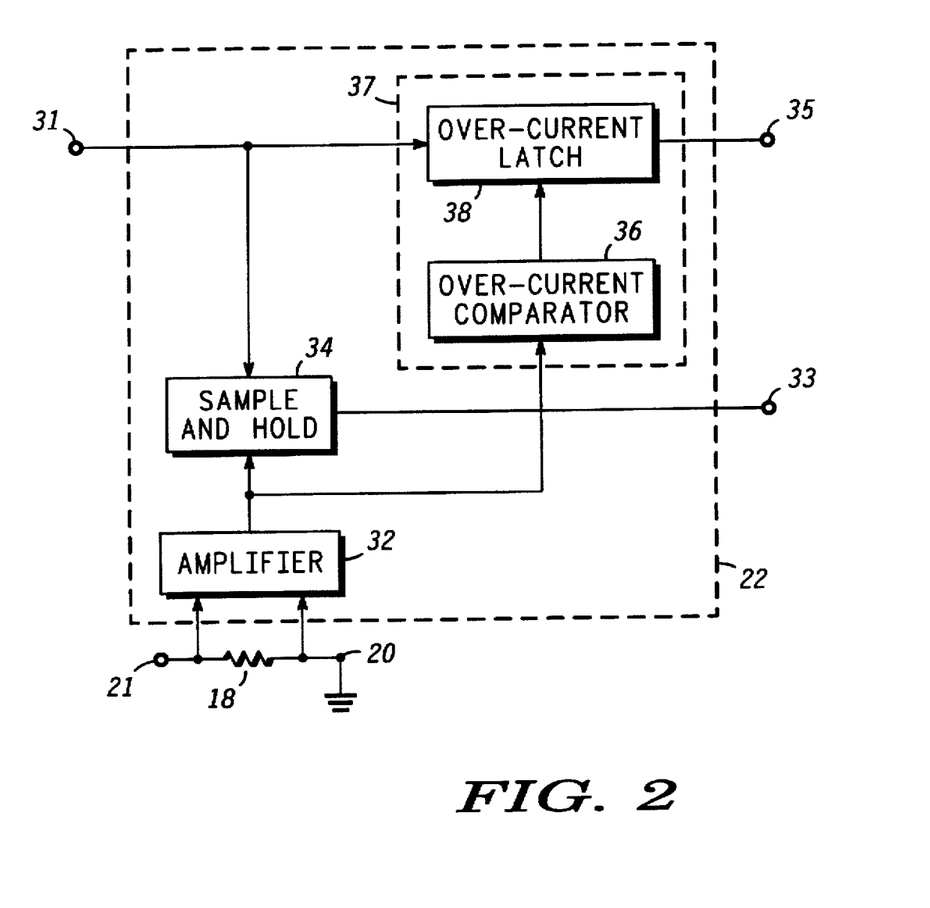
FIG. 2 is a block diagram of a portion of the circuit of FIG. 1 for sensing and reconstructing the phase current.

FIG. 2 is a block diagram of a portion of phase current reconstruction circuit 10 shown in FIG. 1. It should be understood that the same reference numerals are used in the figures to denote the same elements. Therefore, node 21 represents node 21A, 21B, or 21C and is connected to the lower leg of the corresponding phase bridge 12A, 12B, or 12C as shown in FIG. 1. Sensing resistor 18 represents sensing resistor 18A, 18B, or 18C as shown in FIG. 1. Likewise, phase current reconstruction element 22 represents phase current reconstruction element 22A, 22B, or 22C in phase current reconstruction circuit 10 of FIG. 1. Phase current reconstruction element 22 includes an amplifier 32, a sample and hold circuit 34, and an over-current protection element 37. Two inputs of amplifier 32 serve as the sensing inputs of phase current reconstruction element 22 and are connected across sensing resistor 18. An output of amplifier 32 is connected to an input of sample and hold circuit 34. A control input of sample and hold circuit 34 is coupled to control input 31 of phase current reconstruction element 22. An output of sample and hold circuit 34 serves as output 33 of phase current reconstruction element 22. Over-current protection element 37 includes an over-current comparator 36 and an over-current latch 38. An input of over-current comparator 36 is coupled to the output of amplifier 32. An output of over-current comparator 36 is coupled to a first input of over-current latch 38. A second input of over-current latch 38 is coupled to control input 31 of phase current reconstruction element 22. An output of over-current latch 38 is coupled to control output 35 of phase current reconstruction element 22.

In operation, amplifier 32 senses a current in sensing resistor 18 by measuring a voltage across sensing resistor 18. Amplifier 32 then amplifies the measured voltage. The current in sensing resistor 18 is equal to the phase current when the transistor in the lower leg of the corresponding phase bridge is on. When the transistor in the lower leg is off, the current flows through the transistor or the diode in the upper leg of the corresponding phase bridge. Thus, the time dependence of the current in sensing resistor 18 is a chopped sine wave. Sample and hold circuit 34 reconstructs the phase current from the chopped sine wave sensed from the current in sensing resistor 18 and amplified by amplifier 32. Over-current comparator 36 compares the voltage output of amplifier 32 with a predetermined reference voltage level to detect the over-current in sensing resistor 18. If an overcurrent is detected, over-current comparator 36 sends a signal to over-current latch 38, which in turn interrupts the transmission of the pulse width modulation signal from microcontroller 26, through control input 31 and control output 35 of phase current reconstruction element 22, to the corresponding gate drive circuit, thereby switching off the transistor in the lower leg of the corresponding phase bridge.

Figure 3:
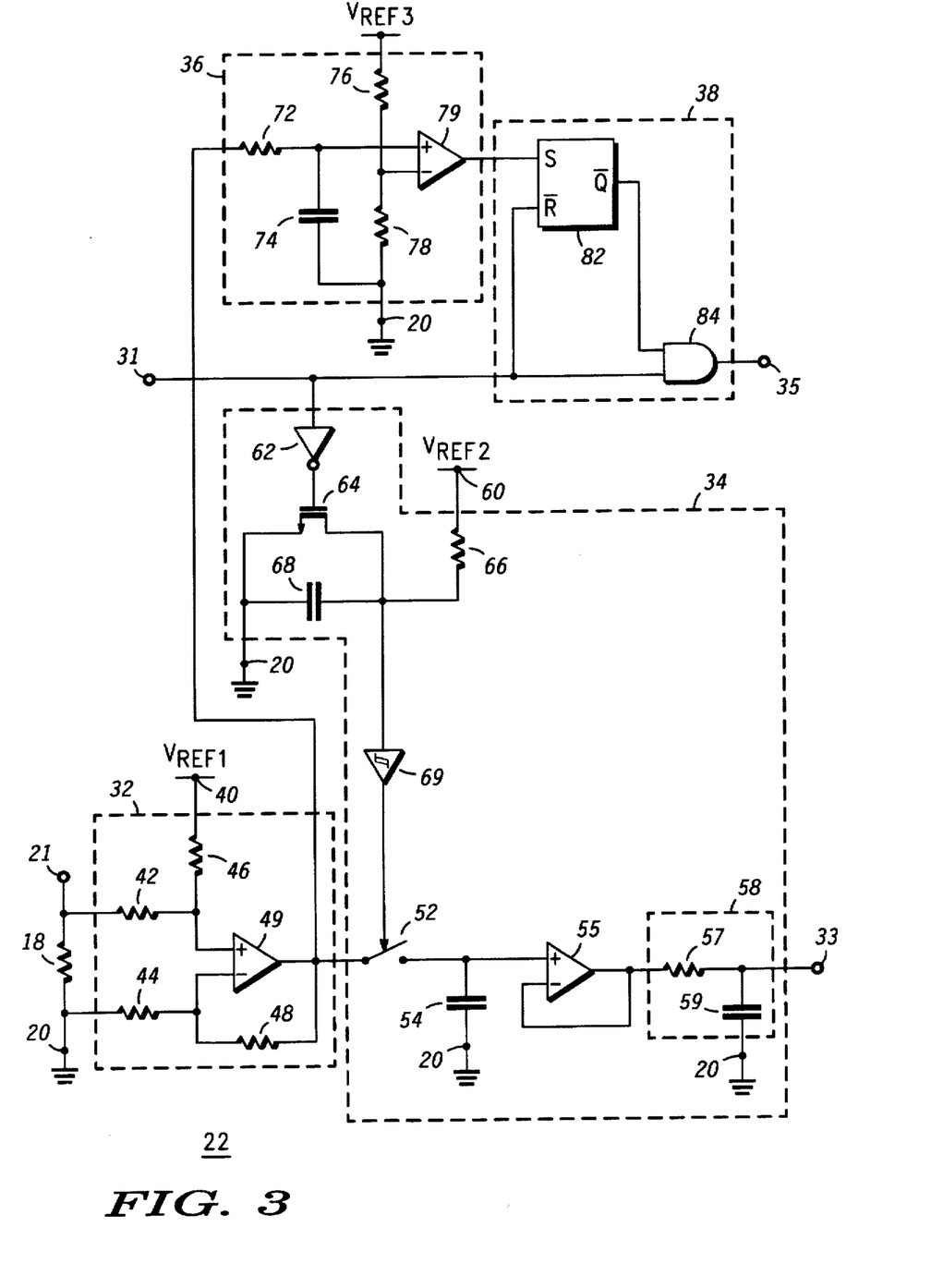
FIG. 3 is schematic diagram of the portion of the circuit of FIG. 2 for sensing and reconstructing the phase current.

FIG. 3 is schematic diagram of the portion of the circuit shown in FIG. 2 for sensing and reconstructing the phase current. Amplifier 32 includes an operational amplifier 49 and resistors 42, 44, 46, and 48. A first electrode of resistor 42 serves as the first sensing input of phase current reconstruction element 22 and is connected to the first electrode of sensing resistor 18. A first electrode of resistor 44 serves as the second sensing input of phase current reconstruction element 22 and is connected to the second electrode of sensing resistor 18. A second electrode of resistor 42 and a second electrode of resistor 44 are connected to a non-inverting input and an inverting input, respectively, of operational amplifier 49. The non-inverting input of operational amplifier 49 is coupled through resistor 46 to a node 40 for receiving a reference voltage, $V_{REF1}$, of, for example, 2.5 volts (V). The inverting input of operational amplifier 49 is coupled to an output of operational amplifier 49 via resistor 48. The output of operational amplifier 49 serves as the output of amplifier 32. When the resistance of resistor 44 is equal to that of resistor 42 and the resistance of resistor 48 is equal to that of resistor 46, amplifier 32 is configured as a differential amplifier having a voltage gain equal to the ratio of the resistance of resistor 46 to that of resistor 42. When the current in sensing resistor 18 is zero, the voltage at the output of amplifier 32 is equal to the reference voltage $V_{REF1}$ at node 40. When a non-zero current flows through sensing resistor 18 from node 21 to node 20, the voltage at the output of amplifier 32 is above the reference voltage $V_{REF1}$ at node 40 by an amount equal to the voltage across sensing resistor 18 multiplied by the voltage gain of amplifier 32. It should be understood that amplifier 32 is not limited to being configured as a differential amplifier as shown in FIG. 3. Suitable configurations for amplifier 32 include a non-inverting amplifier, an inverting amplifier, a single-ended amplifier, or the like.

Sample and hold circuit 34 includes an analog switch 52, a capacitor 54, an operational amplifier 55, and a low pass filter 58. A first electrode of analog switch 52 serves as the input of sample and hold circuit 34 and is connected to the output of amplifier 32. A second electrode of analog switch 52 is connected to a first electrode of capacitor 54. A second electrode of capacitor 54 is connected to node 20. A non-inverting input of operational amplifier 55 is connected to the first electrode of capacitor 54. An inverting input of operational amplifier 55 is connected to an output of operational amplifier 55. Operational amplifier 55 has a voltage gain of one and, therefore, serves as a buffer between the first electrode of capacitor 54 and filter 58. Filter 58 includes a resistor 57 and a capacitor 59. A first electrode of resistor 57 is connected to the output of operational amplifier 55. A second electrode of resistor 57 is connected to a first electrode of capacitor 59, forming output 33 of phase current reconstruction element 22. A second electrode of capacitor 59 is connected to node 20.

Sample and hold circuit 34 further includes a delay circuit, which comprises an inverter 62, a field effect transistor (FET) 64, a resistor 66, a capacitor 68, and a Schmitt trigger 69. An input of inverter 62 is coupled to control input 31 of phase current reconstruction element 22 and an output of inverter 62 is connected to a gate electrode of FET 64. A source electrode of FET 64 is connected to node 20. A drain electrode of FET 64 is coupled through resistor 66 to a node 60 for receiving a reference voltage, $V_{REF2}$, of, for example, 5 V. The drain electrode of FET 64 is also coupled to node 20 via capacitor 68. An input of Schmitt trigger 69 is connected to the drain electrode of FET 64 and an output of Schmitt trigger 69 is connected to a control electrode of analog switch 52. It should be understood that FET 64 functions as a switch and, therefore, is not limited to being a metal oxide semiconductor field effect transistor in the present invention. Any switch having a control electrode and two current conducting electrodes can replace FET 64. For example, FET 64 may be replaced by an insulated gate bipolar transistor, a bipolar transistor, or the like.

Over-current comparator 36 includes a capacitor 74, a comparator 79, and resistors 72, 76, and 78. A first electrode of resistor 72 serves as the input of over-current comparator 36 and is connected to the output of amplifier 32. A second electrode of resistor 72 is connected to a first electrode of capacitor 74 and to a non-inverting input of comparator 79. A second electrode of capacitor 74 is connected to node 20. A first electrode of resistor 76 is connected to a node 70 for receiving a reference voltage, $V_{REF3}$, of, for example, 5 V. A second electrode of resistor 76 is connected to a first electrode of resistor 78 and to an inverting input of comparator 79. A second electrode of resistor 78 is connected to node 20. An output of comparator 79 serves as the output of over-current comparator 36.

Over-current latch 38 includes a storage element 82 and a logic gate 84. In the embodiment show in FIG. 3, storage element 82 is a flip-flop and logic gate 84 is an AND gate. A set input (S) of flip-flop 82 serves as the first input of over-current latch 38 and is connected to the output of over-current comparator 36. An active low reset input ($\overline{R}$) serves as the second input of over-current latch 38 and is connected to control input 31 of phase current reconstruction element 22. An inverting output ($\overline{Q}$) of flip-flop 82 is connected to a first input of logic AND gate 84. A second input of logic AND gate 84 is connected to the active low reset input ($\overline{R}$) of flip-flop 82. An output of logic AND gate 84 serves as control output 35 of phase current reconstruction element 22.

In operation, amplifier 32 senses a current in sensing resistor 18 by measuring a voltage across sensing resistor 18. The measured voltage across sensing resistor 18 is amplified by operational amplifier 49 and shifted to a voltage level equal to the reference voltage $V_{REF1}$. Therefore, when the current in sensing resistor 18 is zero, the voltage at the output of amplifier 32 is equal to the reference voltage $V_{REF1}$, and when a non-zero current flows through sensing resistor 18 from node 21 to node 20, the voltage at the output of amplifier 32 is above the reference voltage $V_{REF1}$ by an amount equal to the voltage across sensing resistor 18 multiplied by the voltage gain of amplifier 32. The current in sensing resistor 18 is equal to the phase current when the transistor in the lower leg of the corresponding phase bridge is on. When the transistor in the lower leg is off, the current flows through the transistor or the diode in the upper leg of the corresponding phase bridge. Thus, the time dependence of the current in sensing resistor 18 is a chopped sine wave, thereby resulting in the voltage at the output of amplifier 32 and the first electrode of analog switch 52 being a chopped sine wave.

Sample and hold circuit 34 reconstructs the phase current from the chopped sine wave voltage signal at the first electrode of analog switch 52.

When the pulse width modulation signal at control input 31 switches from a low voltage level to a high voltage level, inverter 62 switches off FET 64, thereby interrupting a current path from node 60 through resistor 66 and FET 64 to node 20. The voltage across nodes 60 and 20 generates a current through resistor 66. The current through resistor 66 charges capacitor 68 and the voltage across capacitor 68 starts to increase. After a time interval determined by the resistance of resistor 66 and the capacitance of capacitor 68, the voltage across capacitor 68 reaches a triggering voltage of Schmitt trigger 69, resulting in a high voltage level appearing at the output of Schmitt trigger 69. The high voltage level at the output of Schmitt trigger 69 switches on analog switch 52 and sample and hold circuit 34 enters a sampling mode. Because the pulse width modulation signal at control input 31 of phase current reconstruction element 22 also controls the transistor in the lower leg of the corresponding phase bridge, the current in sensing resistor 18 is equal to the phase current in the lower leg of the corresponding phase bridge when analog switch 52 is switched on by Schmitt trigger 69. Through analog switch 52, the voltage at the output of amplifier 32 charges capacitor 54 and is transmitted to the output of operational amplifier 55.

When the pulse width modulation signal at control input 31 switches from a high voltage level to a low voltage level, inverter 62 switches on FET 64, thereby establishing a discharging path for capacitor 68. The voltage across capacitor 68 is now equal to the voltage across the drain and source electrodes of FET 64, which is in a conductive state. The low voltage across capacitor 68 results in a low voltage level appearing at the output of Schmitt trigger 69, thereby switching off analog switch 52. Because the pulse width modulation signal at control input 31 of phase current reconstruction element 22 also controls the transistor in the lower leg of the corresponding phase bridge, the current in sensing resistor 18 is zero when analog switch 52 is switched off by Schmitt trigger 69. Sample and hold circuit 34 is now in a holding mode. Capacitor 54 maintains the voltage level at the input of operational amplifier 55, thereby maintaining the voltage level at the output of operational amplifier 55.

As described supra, the voltage level at the output of operational amplifier 55 is proportional to the current in sensing resistor 18 when analog switch 52 is on and remains constant when analog switch 52 is off. Thus, the voltage at the output of operational amplifier 55 is proportional to a reconstructed phase current with distortion in the sine wave when the transistor in the lower leg of the corresponding phase bridge is off. The reconstructed sine wave is transmitted to output 33 of phase current reconstruction element 22 via low pass filter 58 to reduce the distortion in the reconstructed sine wave.

Over-current comparator 36 detects an over-current condition in the lower leg of the corresponding phase bridge. The voltage at the output of amplifier 32 is transmitted to the non-inverting input of comparator 79 via a low pass filter formed by resistor 72 and capacitor 74. The voltage at the inverting input of comparator 79 is derived from the reference voltage $V_{REF3}$ at node 70 through a voltage divider formed by resistors 76 and 78. If the voltage at the non-inverting input of comparator 79 is lower than the voltage at the inverting input of comparator 79, a logic low voltage level appears at the output of comparator 79, indicating that no over-current in the lower leg of the corresponding phase bridge is detected. If the voltage at the non-inverting input of comparator 79 is higher than the voltage at the inverting input of comparator 79, a logic high voltage level appears at the output of comparator 79, indicating that an over-current in the lower leg of the corresponding phase bridge is detected. The voltage level at the output of comparator 79 is transmitted to the set input (S) of flip-flop 82 of over-current latch 38.

If no over-current is detected, the voltage at the set input (S) of flip-flop 82 is at a logic low voltage level. When the pulse width modulation signal at the active low reset input ($\overline{R}$) of flip-flop 82 is at a logic low voltage level, a logic high voltage level appears at the inverting output ($\overline{Q}$) of flip-flop 82 and the first input of logic AND gate 84. When the pulse width modulation signal at the active low reset input ($\overline{R}$) of flip-flop 82 switches to a logic high voltage level, the voltage at the inverting output ($\overline{Q}$) of flip-flop 82 and the first input of logic AND gate 84 remains at the logic high voltage level. Thus, the voltage level at the output of logic AND gate 84 is determined by the voltage level at the second input of logic AND gate 84. The pulse width modulation signal at control input 31 of phase current reconstruction element 22 is transmitted through logic AND gate 84 and control output 35 of phase current reconstruction element 22 to the lower gate drive circuit of the corresponding phase bridge.

If an over-current is detected, the voltage at the set input (S) of flip-flop 82 is at a logic high voltage level. Because the over-current condition in the lower leg of a phase bridge occurs only while the transistor in the lower leg of the corresponding phase bridge is switched on by a high voltage level of the pulse width modulation signal, the logic high voltage level at the set input (S) of flip-flop 82 occurs only when the pulse width modulation signal at the active low reset input ($\overline{R}$) of flip-flop 82 is at a logic high voltage level. Flip-flop 82, having both the set input (S) and the active low reset input ($\overline{R}$) at the logic high voltage level, generates a logic low voltage level at its inverting output ($\overline{Q}$) and the first input of logic AND gate 84, resulting in a logic low voltage level appearing at the output of logic AND gate 84. The logic low voltage level at the output of logic AND gate 84 is transmitted to the lower gate drive circuit of the corresponding phase bridge, which then switches off the transistor in the lower leg of the corresponding phase bridge. When the transistor in the lower leg of the corresponding phase bridge is switched off, the over-current condition disappears, resulting in a logic low voltage level appearing at the set input (S) of flip-flip 82. However, the voltage at the inverting output ($\overline{Q}$) of flip-flop 82 and the output of logic AND gate 84 remains at the logic low voltage level until flip-flop 82 is reset by a low voltage level of the pulse width modulation signal at the active low reset input ($\overline{R}$) of flip-flip 82. Therefore, if an over-current condition is detected in the lower leg of a phase bridge during a cycle of the phase modulation signal, the transistor in the lower leg of the corresponding phase bridge is latched in the non-conductive state for the remaining part of the corresponding cycle of the pulse width modulation signal.

By now it should be appreciated that a circuit and a method for sensing and reconstructing the phase current have been provided. In accordance with the present invention, a sensing resistor and a phase current reconstruction element are used to sense and reconstruct the phase current in each phase. Therefore, the present invention provides information (e.g., current magnitude, voltage vector, power factor) for the proper operation of the motor and protects the power switch in the lower leg of the phase bridge from over-current. Furthermore, the circuit in accordance with the present invention is inexpensive, simple, and sufficiently small to be easily integrated into a power module.

I claim:

1. A phase current reconstruction circuit, comprising:

a first phase bridge having a first electrode coupled for receiving a first supply voltage, a second electrode, a first control input, a second control input, and an output coupled for providing a first phase output;

a first sensing resistor having a first electrode coupled to the second electrode of the first phase bridge and a second electrode coupled for receiving a second supply voltage;

a first phase current reconstruction element having a first sensing input coupled to the first electrode of the first sensing resistor, a second sensing input coupled to the second electrode of the first sensing resistor, an output, a control input, and a control output coupled to the second control input of the first phase bridge, wherein the first phase current reconstruction element includes:

an amplifier having a first input coupled to the first sensing input of the first phase current reconstruction element, a second input coupled to the second sensing input of the first phase current reconstruction element, and an output; and a sample and hold circuit having a control electrode coupled to the control input of the first phase current reconstruction element, an input coupled to the output of the amplifier, and an output coupled to the output of the first phase current reconstruction element; and a microcontroller having a first input coupled to the output of the first phase current reconstruction element, a first upper output coupled to the first control input of the first phase bridge, and a first lower output coupled to the control input of the first phase current reconstruction element.

2. The phase current reconstruction circuit of claim 1, wherein the first phase bridge includes:

a first power switch having a control electrode coupled to the first control input of the first phase bridge, a first current conducting electrode coupled to the output of the first phase bridge, and a second current conducting electrode coupled to the first electrode of the first phase bridge;

a first diode having an anode coupled to the first current conducting electrode of the first power switch and a cathode coupled to the second current conducting electrode of the first power switch;

a second power switch having a control electrode coupled to the second control input of the first phase bridge, a first current conducting electrode coupled to the second electrode of the first phase bridge, and a second current conducting electrode coupled to the first current conducting electrode of the first power switch; and a second diode having an anode coupled to the first current conducting electrode of the second power switch and a cathode coupled to the second current conducting electrode of the second power switch.

3. The phase current reconstruction circuit of claim 1, wherein the amplifier includes:

a first resistor having a first electrode coupled to the first input of the amplifier, and a second electrode;

a second resistor having a first electrode coupled to the second input of the amplifier, and a second electrode;

a third resistor having a first electrode coupled to the second electrode of the first resistor and a second electrode coupled for receiving a reference voltage;

a fourth resistor having a first electrode coupled to the second electrode of the second resistor, and a second electrode; and an operational amplifier having a non-inverting input coupled to the second electrode of the first resistor, an inverting input coupled to the second electrode of the second resistor, and an output coupled to the second electrode of the fourth resistor and to the output of the amplifier.

4. The phase current reconstruction circuit of claim 1, wherein the sample and hold circuit includes:

an analog switch having an input coupled to the input of the sample and hold circuit, a control electrode coupled to the control electrode of the sample and hold circuit, and an output;

a first capacitor having a first electrode coupled to the output of the analog switch and a second electrode coupled for receiving the second supply voltage;

a buffer having an input coupled to the first electrode of the first capacitor, and an output; and a filter having an input coupled to the output of the buffer and an output coupled to the output of the sample and hold circuit.

5. The phase current reconstruction circuit of claim 4, wherein the control electrode of the analog switch is coupled to the control electrode of the sample and hold circuit via a delay circuit in the sample and hold circuit, and wherein the delay circuit includes:

an inverter having an input coupled to the control electrode of the sample and hold circuit, and an output;

a switch having a control electrode coupled to the output of the inverter, a first current conducting electrode coupled for receiving the second supply voltage, and a second current conducting electrode;

a resistor having a first electrode coupled for receiving a reference voltage and a second electrode coupled to the second current conducting electrode of the switch;

a second capacitor having a first electrode coupled to the second electrode of the resistor and a second electrode coupled for receiving the second supply voltage; and a trigger having an input coupled to the second electrode of the resistor and an output coupled to the control electrode of the analog switch.

6. The phase current reconstruction circuit of claim 1, wherein the first phase current reconstruction element further includes:

an over-current comparator having an input coupled to the output of the amplifier, and an output; and an over-current latch having a first input coupled to the output of the over-current comparator, a second input coupled to the control electrode of the sample and hold circuit, and an output coupled to the control output of the first phase current reconstruction element.

7. The phase current reconstruction circuit of claim 6, wherein the over-current comparator includes:

a first resistor having a first electrode coupled to the input of the over-current comparator, and a second electrode;

a capacitor having a first electrode coupled to the second electrode of the first resistor and a second electrode coupled for receiving the second supply voltage;

a second resistor having a first electrode coupled for receiving a reference voltage, and a second electrode;

a third resistor having a first electrode coupled to the second electrode of the second resistor and a second electrode coupled for receiving the second supply voltage; and a comparator having a non-inverting input coupled to the second electrode of the first resistor, an inverting input coupled to the second electrode of the second resistor, and an output coupled to the output of the over-current comparator.

8. The phase current reconstruction circuit of claim 6, wherein the over-current latch includes:

a storage element having a set input coupled to the first input of the over-current latch, a reset input coupled to the second input of the over-current latch, and an inverting output; and a logic gate having a first input coupled to the inverting output of the storage element, a second input coupled to the reset input of the storage element, and an output coupled to the output of the over-current latch.

9. The phase current reconstruction circuit of claim 1, wherein:

the first upper output of the microcontroller is coupled to the first control input of the first phase bridge via a first upper drive circuit, the first upper drive circuit having an input coupled to the first upper output of the microcontroller and an output coupled to the first control input of the first phase bridge:

the control output of the first phase current reconstruction element is coupled to the second control input of the first phase bridge via a first lower drive circuit, the first lower drive circuit having an input coupled to the control output of the first phase current reconstruction element and an output coupled to the second control input of the first phase bridge:

the microcontroller further has a second input, a second upper output, a second lower output, a third input, a third upper output, and a third lower output; and the phase current reconstruction circuit further comprises:

a second phase bridge having a first electrode coupled for receiving the first supply voltage, a second electrode, a first control input, a second control input, and an output coupled for providing a second phase output;

a second sensing resistor having a first electrode coupled to the second electrode of the second phase bridge and a second electrode coupled for receiving the second supply voltage;

a second phase current reconstruction element having a first sensing input coupled to the first electrode of the second sensing resistor, a second sensing input coupled to the second electrode of the second sensing resistor, an output coupled to the second input of the microcontroller, a control input coupled to the second lower output of the microcontroller, and a control output;

a second upper drive circuit having an input coupled to the second upper output of the microcontroller and an output coupled to the first control input of the second phase bridge;

a second lower drive circuit having an input coupled to the control output of the second phase current reconstruction element and an output coupled to the second control input of the second phase bridge;

a third phase bridge having a first electrode coupled fore receiving the first supply voltage, a second electrode, a first control input, a second control input, and an output coupled for providing a third phase output;

a third sensing resistor having a first electrode coupled to the second electrode of the third phase bridge and a second electrode coupled for receiving the second supply voltage;

a third phase current reconstruction element having a first sensing input coupled to the first electrode of the third sensing resistor, a second sensing input coupled to the second electrode of the third sensing resistor, an output coupled to the third input of the microcontroller, a control input coupled to the third lower output of the microcontroller, and a control output;

a third upper drive circuit having an input coupled to the third upper output of the microcontroller and an output coupled to the first control input of the third phase bridge; and a third lower drive circuit having an input coupled to the control output of the third phase current reconstruction element and an output coupled to the second control input of the third phase bridge.

10. A phase current reconstruction circuit, comprising:

a plurality of phase bridges, each phase bridge of the plurality of phase bridges having a first electrode coupled for receiving a first supply voltage, a second electrode, a first control input, a second control input, and an output coupled for providing a phase output;

a plurality of sensing resistors, each sensing resistor of the plurality of sensing resistors having a first electrode coupled to the second electrode of a corresponding phase bridge and a second electrode coupled for receiving a second supply voltage;

a plurality of phase current reconstruction elements, each phase current reconstruction element of the plurality of phase current reconstruction elements having a first sensing input coupled to the first electrode of a corresponding sensing resistor, a second sensing input coupled to the second electrode of the corresponding sensing resistor, an output, a control input, and a control output;

a microcontroller having a plurality of inputs, a plurality of lower outputs, and a plurality of upper outputs, each input of the plurality of inputs being coupled to the output of a corresponding phase current reconstruction element and each lower output of the plurality of lower outputs being coupled to the control input of the corresponding phase current reconstruction element;

a plurality of lower drive circuits, each lower drive circuit of the plurality of lower drive circuits having an input coupled to the control output of a corresponding phase current reconstruction element and an output coupled to the second control input of a corresponding phase bridge; and a plurality of upper drive circuits, each upper drive circuit of the plurality of upper drive circuits having an input coupled to a corresponding upper output of the microcontroller and an output coupled to the first control input of a corresponding phase bridge.

11. The phase current reconstruction circuit of claim 10, wherein each phase bridge of the plurality of phase bridges includes:

a first insulated gate bipolar transistor having a gate electrode coupled to the first control input of the phase bridge, an emitter electrode coupled to the output of the phase bridge, and a collector electrode coupled to the first electrode of the phase bridge;

a first diode having an anode coupled to the emitter electrode of the first insulated gate bipolar transistor and a cathode coupled to the collector electrode of the first insulated gate bipolar transistor;

a second insulated gate bipolar transistor having a gate electrode coupled to the second control input of the phase bridge, an emitter electrode coupled to the second electrode of the phase bridge, and a collector electrode coupled to the emitter electrode of the first insulated gate bipolar transistor; and a second diode having an anode coupled to the emitter electrode of the second insulated gate bipolar transistor and a cathode coupled to the collector electrode of the second insulated gate bipolar transistor.

12. The phase current reconstruction circuit of claim 10, wherein each phase current reconstruction element of the plurality of phase current reconstruction elements includes:

an amplifier having a first input coupled to the first sensing input of the phase current reconstruction element, a second input coupled to the second sensing input of the phase current reconstruction element, and an output;

a sample and hold circuit having a control electrode coupled to the control input of the phase current reconstruction element, an input coupled to the output of the amplifier, and an output coupled to the output of the phase current reconstruction element; and an over-current protection element having a first input coupled to the output of the amplifier, a second input coupled to the control electrode of the sample and hold circuit, and an output coupled to the control output of the phase current reconstruction element.

13. The phase current reconstruction circuit of claim 12, wherein the amplifier includes:

a first resistor having a first electrode coupled to the first input of the amplifier, and a second electrode;

a second resistor having a first electrode coupled to the second input of the amplifier, and a second electrode;

a third resistor having a first electrode coupled to the second electrode of the first resistor and a second electrode coupled for receiving a reference voltage;

a fourth resistor having a first electrode coupled to the second electrode of the second resistor and a second electrode coupled to the output of the amplifier; and an operational amplifier having a non-inverting input coupled to the second electrode of the first resistor, an inverting input coupled to the second electrode of the second resistor, and an output coupled to the second electrode of the fourth resistor.

14. The phase current reconstruction circuit of claim 12, wherein the sample and hold circuit includes:

an analog switch having an input coupled to the input of the sample and hold circuit, an output, and a control electrode;

a first capacitor having a first electrode coupled to the output of the analog switch and a second electrode coupled for receiving the second supply voltage;

a buffer having an input coupled to the first electrode of the first capacitor, and an output;

a first resistor having a first electrode coupled to the output of the buffer and a second electrode coupled to the output of the sample and hold circuit;

a second capacitor having a first electrode coupled to the second electrode of the first resistor and a second electrode coupled for receiving the second supply voltage;

an inverter having an input coupled to the control electrode of the sample and hold circuit, and an output;

a field effect transistor having a gate electrode coupled to the output of the inverter, a source electrode coupled for receiving the second supply voltage, and a drain electrode;

a second resistor having a first electrode coupled for receiving a reference voltage and a second electrode coupled to the drain electrode of the field effect transistor;

a third capacitor having a first electrode coupled to the second electrode of the second resistor and a second electrode coupled for receiving the second supply voltage; and a trigger having an input coupled to the second electrode of the second resistor and an output coupled to the control electrode of the analog switch.

15. The phase current reconstruction circuit of claim 12, wherein the over-current protection element includes:

a first resistor having a first electrode coupled to the first input of the over-current protection element, and a second electrode;

a first capacitor having a first electrode coupled to the second electrode of the first resistor and a second electrode coupled for receiving the second supply voltage;

a second resistor having a first electrode coupled for receiving a reference voltage, and a second electrode;

a third resistor having a first electrode coupled to the second electrode of the second resistor and a second electrode coupled for receiving the second supply voltage;

a comparator having a non-inverting input coupled to the second electrode of the first resistor, an inverting input coupled to the second electrode of the second resistor, and an output;

a flip-flop having a set input coupled to the output of the comparator, a reset input coupled to the second input of the over-current protection element, and an inverting output; and an AND gate having a first input coupled to the inverting output of the flip-flop, a second input coupled to the reset input of the flip-flop, and an output coupled to the output of the over-current protection element.

16. A method for reconstructing a phase current, comprising the steps of:

sensing a first phase current in a first phase bridge to generate a first voltage signal;

amplifying the first voltage signal to generate a second voltage signal;

sampling the second voltage signal in response to a first control signal being at a first voltage level to form a sampled voltage signal;

generating a third voltage signal using the sampled voltage signal;

holding the third voltage signal constant in response to the first control signal being at a second voltage level;

generating a first phase signal from the third voltage signal, the first phase signal having a first time dependence representing a reconstructed first phase current;

adjusting the first control signal in accordance with the first phase signal; and using the adjusted first control signal to control the first phase bridge to reconstruct the first phase current.

17. The method for reconstructing a phase current as claimed in claim 16, wherein the step of generating a first phase signal includes the step of filtering the third voltage signal.

18. The method for reconstructing a phase current as claimed in claim 16, further comprising the step of interrupting the first phase current in the first phase bridge in response to the first phase current being larger than an over-current value.

19. The method for reconstructing a phase current as claimed in claim 18, wherein the step of interrupting the first phase current in the first phase bridge includes the steps of:

comparing the second voltage with a reference voltage; and interrupting the first control signal in response to the second voltage being higher than the reference voltage.

20. The method for reconstructing a phase current as claimed in claim 18, further comprising the steps of:

generating a second phase signal by sensing a second phase current in a second phase bridge, the second phase signal having a second time dependence representing a reconstructed second phase current;

controlling the second phase current in accordance with the second phase signal;

generating a third phase signal by sensing a third phase current in a third phase bridge, the third phase signal having a third time dependence representing a reconstructed third phase current; and controlling the third phase current in accordance with the third phase signal.

* * * * *